(12) United States Patent
Lepselter

(10) Patent No.: US 6,635,888 B1
(45) Date of Patent: Oct. 21, 2003

(54) HIGH RESOLUTION ELECTRON BEAM EXPOSURE MACHINES

(76) Inventor: Martin P. Lepselter, 25 Sweetbriar Rd., Summit, NJ (US) 07901

( * ) Notice: Subject to any disclaimer, the term of this patent is extended or adjusted under 35 U.S.C. 154(b) by 0 days.

(21) Appl. No.: 09/247,177

(22) Filed: Jan. 2, 1998

(51) Int. Cl.[7] ............................................. H01J 37/30
(52) U.S. Cl. ................................................. 250/492.2
(58) Field of Search ........................ 250/492.2, 492.21

(56) References Cited

U.S. PATENT DOCUMENTS 5,693,950 A * 12/1997 Stengl et al. .......... 250/492.21

2002/0079464 A1 * 6/2002 Dreissen et al.

FOREIGN PATENT DOCUMENTS

JP 2000011933 * 1/2000 ............ H01J/37/06

* cited by examiner

Primary Examiner—John R. Lee
Assistant Examiner—James J. Leybourne
(74) Attorney, Agent, or Firm—Leo Stanger

(57) ABSTRACT

Space charges of electrons which repel one another near masks in electron beam exposure machines are reduced by bleeding gas into the vicinity of the apertures in the mask and pumping the gas out from the direction electron travel.

6 Claims, 3 Drawing Sheets

HIGH RESOLUTION ELECTRON BEAM EXPOSURE MACHINES

FIELD OF THE INVENTION

This invention relates to high resolution electron beam exposure machines such as the type used for submicron lithography, and particularly to space charge neutralization of electrons therein.

BACKGROUND OF THE INVENTION

Electron beam exposure machines for submicron lithography, such as for writing on optical or x-ray mask surfaces, or directly on semiconductor surfaces, pass electrons through apertures of a mask. Such devices are limited by the space charges of electrons which repel one another.

SUMMARY OF THE INVENTION

An embodiment of the invention involves bleeding gas into the vicinity of the apertures in the mask and pumping the gas out from the direction electron travel.

DETAILED DESCRIPTION OF PREFERRED EMBODIMENTS

Figure 1:
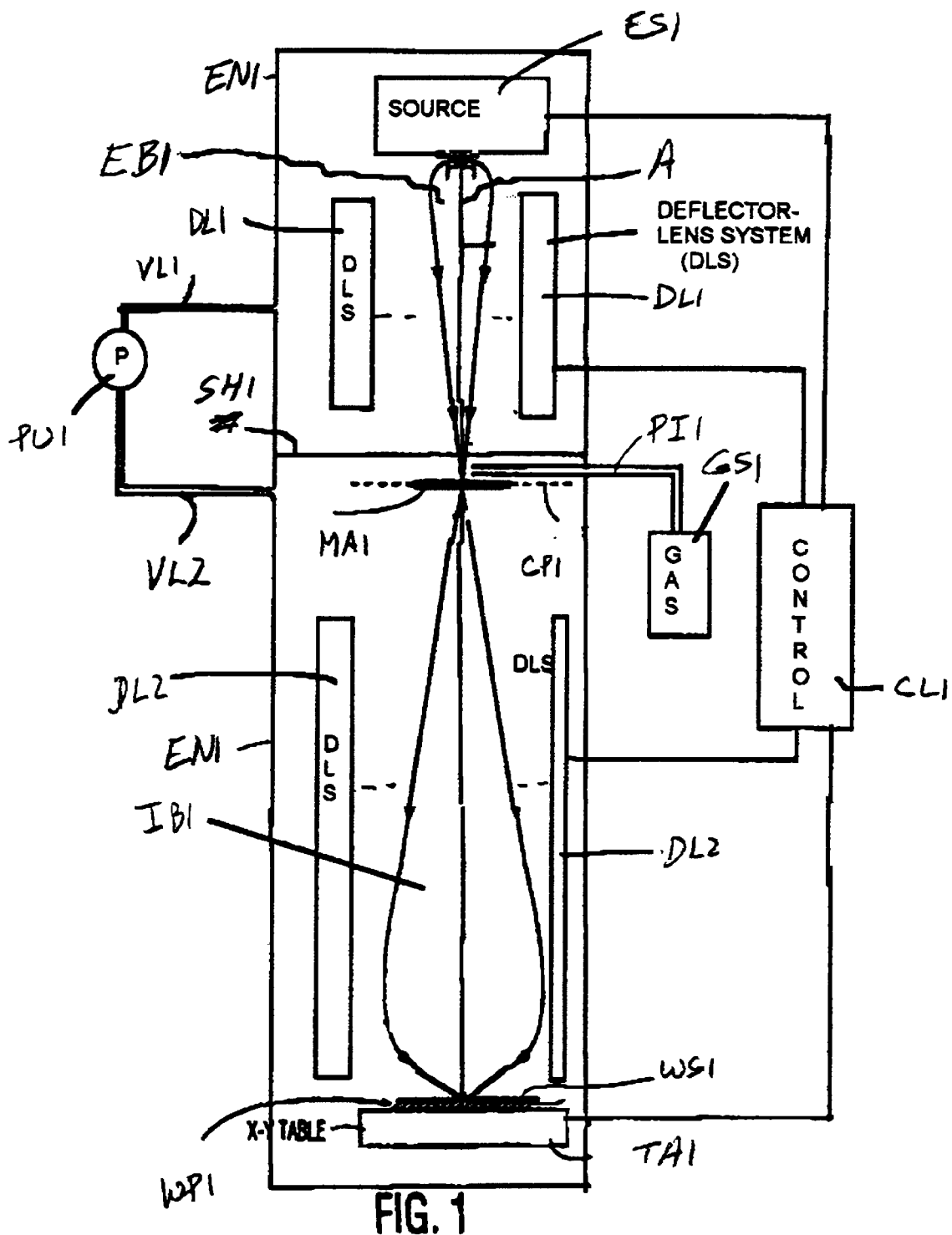
FIG. 1 is a schematic representation of an electron beam exposure system embodying features of the invention.

In the electron-beam exposure system of FIG. 1, an electron source ESI and a first electron-beam deflector-lens system DL1 direct a beam EB1 of electrons about an axis A toward a crossover or focus plane CP1. The sources ES1 and arrangement DL1 together form a structure that includes an electron gun and lenses.

A mask or membrane MA1 at the crossover plane CP1 contains an image which blocks portions of the beam EB1 and allows other portions of the beam to pass through so as to change the beam EB1 into an electron image beam. A second electron-beam deflector-lens system DL2 deflects and demagnifies the beam IB1 emerging from the mask MA1 and focuses the beams on a writing surface WS1 of a workpiece WP1.

The writing surface WS1 is the top surface of an electron-sensitive layer supported on a substrate in the workpiece WP1. A conventional x-y movable table TA1 controls the position of the workpiece WP1 relative to the beam.

Expressly imaging electrons over the surface of the writing surface WS1 on the electron sensitive layer in a high-speed manner makes it possible to create integrated-circuit masks or to write directly on a resist-coated wafer to fabricate extremely small and precise low-cost integrated circuits.

The deflector-lens systems DL1 and DL2 form an electron-beam column, i.e. beams EB1 and IB1. The paths of the electrons emitted by the source ES1 successively diverge, converge, diverge again, and converge again as the electrons travel downstream along a longitudinal axis toward the writing surface WS1. A vacuum enclosure EN1 envelops the entire system and a pump PU1 evacuates the interior of the enclosure EN1 to a high vacuum.

A pipe PI1 leads gas from a gas supply GS1 to a location just above the mask MA1. The gas passes through openings in the mask MA1 and is drawn out by the action of the pump PU1. To direct the gas flow downwardly and prevent upward gas flow, a shroud SH1 separates the interior of the enclosure EN1 into upper and lower parts. Separate vacuum lines VL1 and VL2 from the pump PU1 evacuate the part of the enclosure interior above the shroud SH1 and below the shroud. A control CL1 controls the operation of deflector lens systems DL1 and DL2 as well as the source ES1 and the table TA1.

Figure 2:
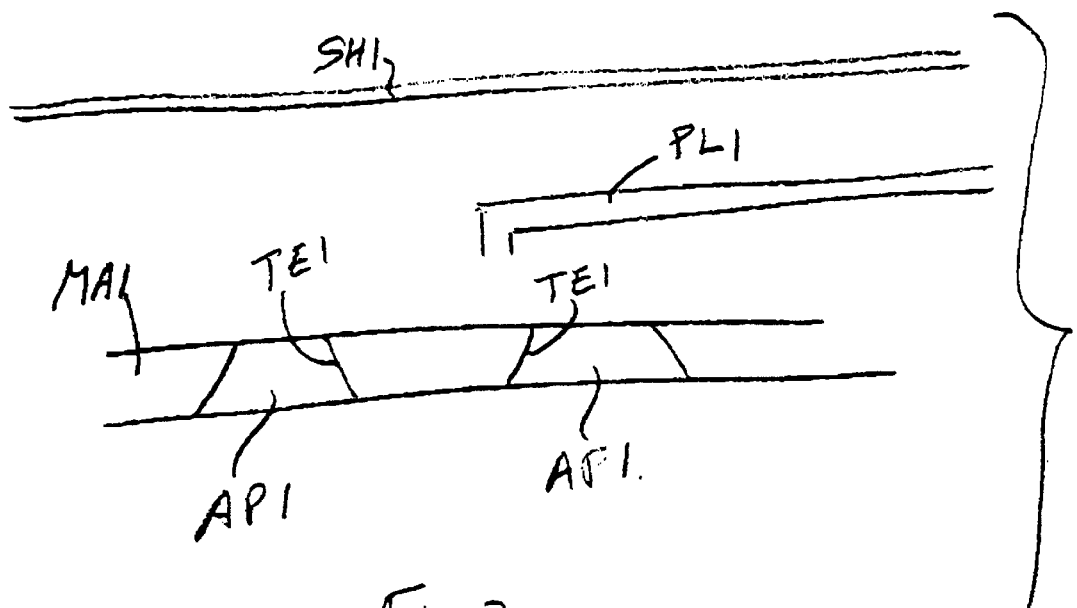
FIGS. 2 and 3 are schematic cross sectional representations of a membrane having apertures and its vicinity for use in the embodiment of FIG. 1.
Figure 3:
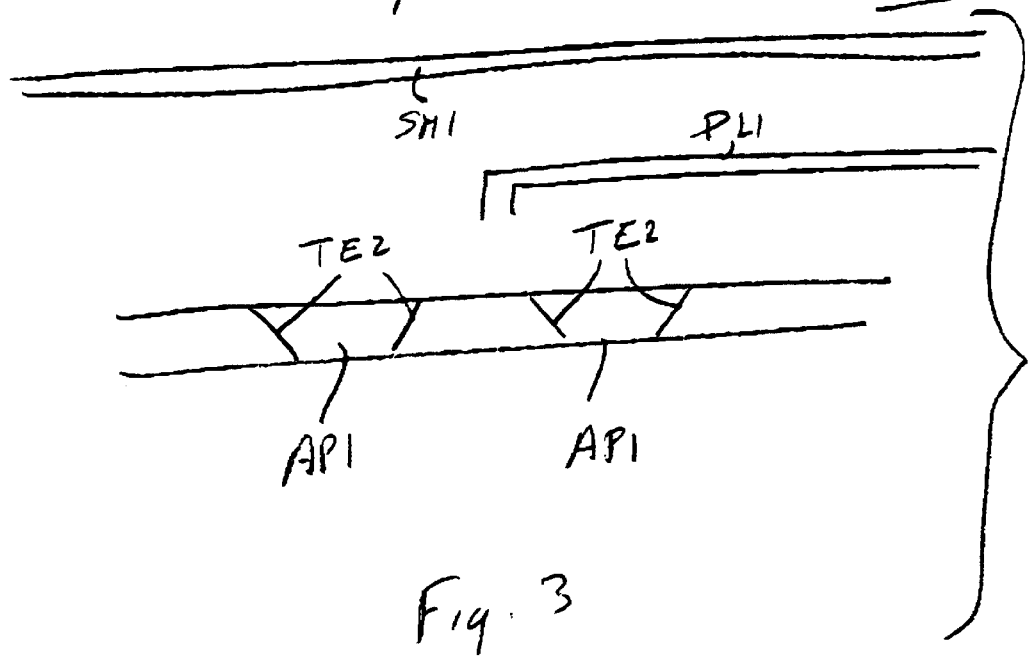

FIG. 2 illustrates a cross-section of the mask or membrane MA1. In one embodiment, apertures AP1 in the mask MA1 form the openings that make the image and have tapered edges TE1 and lie in the path of electrons coming from the source ES1. The pipe PI1 bleeds gas in above the mask MA1 and the line VL2 from the pump PU1 pumps the gas out from below the mask MA1 at a high rate. This results in a gas pressure which is relatively high only above and in the openings or apertures AP1 and dissipates quickly down the column. Various pressures above the mask may be used and one-tenth atmosphere is one example. This produces the pressure mainly just above the mask MA1. In the embodiment of FIG. 2 the tapered edges TE1 of the apertures AP1 increase the sizes of the apertures downwardly. In the embodiment of FIG. 3, the apertures AP1 have edges TE2 which taper to decrease the sizes of the apertures downwardly.

In another embodiment, pipes feed the gas in horizontally and pump it out fast from below so that gas pressure is high only in the apertures and dissipates quickly down the column.

Although electrons passing through the openings or apertures of the mask MA1 are usually spaced from each other far enough vertically to prevent mutual repulsion, statistically there are enough instances when the electrons pass simultaneously, or nearly simultaneously, past the exit of the same apertures to repel one another. This creates a dispersion which detrimentally affects the resolution of the image being formed. In the aforementioned embodiments, the gases passing through the apertures provide a space charged shield between the electrons and prevent their mutually repulsion. That is, the gas molecules shield electrons from each other.

The apertures AP1 may have diverse sizes but may be vary from submicron diameters to three or four microns and substantially. Electrons passing through small apertures AP1 may be separated from each other vertically by mean free distances such as 57 microns. However, these are only mean distances and statistically electrons passing through apertures AP1 may be adjacent each other. Electrons, of course are small in size relative to such apertures AP1. Gases with molecular sizes of one nanometer passing through such apertures AP1 may have a horizontal mean free path of one micron as compared to the 10 horizontal micron mean free path of electrons.

The presences of the gas molecules in the exits of the apertures shield electrons simultaneously occurring within the apertures, or almost simultaneously occurring within the apertures, from each other.

Example of gases used are helium, neon, argon, krypton, xenon, hydrogen, nitrogen, oxygen, chlorine, mercury gas, sodium gas, cesium gas, and sulphur hexaflouride ($SF_6$).

The invention overcomes substantial portions of the repulsion of electrons from each other as they leave the mask apertures. The molecules shield the electrons from each other. It will be recognized that the structures disclosed with respect to FIGS. 1 to 3 are just examples.

Figure 4:
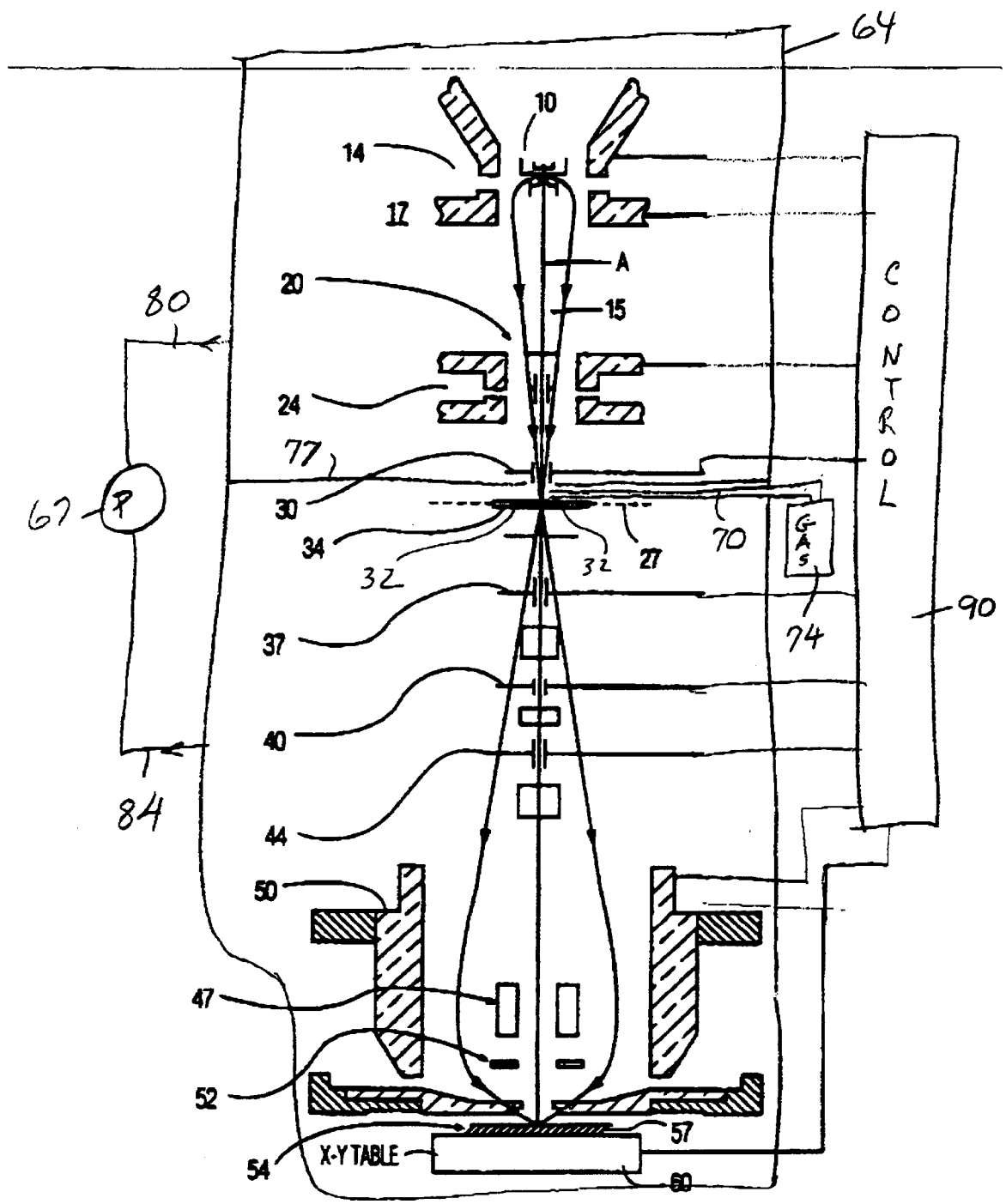
FIG. 4 is a schematic representation of a beam exposure system.

FIG. 4 is a diagram of an electron beam exposure system corresponding to that shown in FIG. 1 in which the beam from the electron source passes through small apertures in the mask and result in separate beamlets. In the electron-beam exposure system of FIG. 4, a field emission electron gun 10 and a first lens 14 constitute an electron source 17 which directs a beam 15 of electrons about an axis A toward a beam limiting aperture 20 of 200 μm. A second lens 24 with an auxiliary blanker converges the resulting electron beam 15 and directs it toward a crossover or focus plane 27 and between selector deflection plates 30.

Apertures 32 in an apertured mask or membrane 34 at the crossover plane 27 divides the beam 15 into individual beamlets according to a profile selected by the selector deflection plates 30. A set of secondary deflection plates 37, 4 μm deflection plates 40, and secondary deflection plates 44 as well as 512 μm deflection coils 47 deflect the beamlets that now form the beam 15 in a manner described with respect to FIGS. 2 to 4. The two sets of deflection plates 37 and 44 work together as a unit. A third lens assembly 50 demagnifies the beams emerging from the mask 34 and, with a fast focus correction coil 52, focuses the beams on the writing surface 54 of a workpiece 57.

The writing surface 54 is the top surface of an electron-sensitive layer supported on a substrate in the workpiece 57. A conventional x-y movable table 60 controls the position of the workpiece 57 relative to the beam. A control 90 controls the operation of the members 10, 14, 17, 24, 20, 37, 40, 44, 50, 47, 52, and 60.

Selectively imaging selected fixed groups of electron spots over the surface of the writing surface 54 on the electron sensitive layer in a high-speed manner makes it possible to create integrated-circuit masks or to write directly on a resist-coated wafer to fabricate extremely small and precise low-cost integrated circuits.

The members 10 to 52 constitute an electron-beam column having highly accurate high-speed deflection capabilities. As shown in FIG. 4, the paths of the electrons emitted by this source successively diverge, converge, diverge again, and converge again as the electrons travel downstream along a longitudinal axis toward the writing surface 54.

For use, a vacuum enclosure 64 envelops the entire system composed of member 10 to 52 and a pump 67 evacuates the interior of the enclosure 64 to a high vacuum. For bleeding gas into the vicinity of the apertures 32 in the mask 34, a pipe 70 leads gas from a gas supply 74 to a location just above the mask 34. The gas passes through the apertures 32 and is drawn out by the action of the pump 67. To direct the gas flow downwardly and prevent upward gas flow, a shroud 77 separates the interior of the enclosure 64 into upper and lower parts. Separate vacuum lines 80 and 84 from the pump 67 evacuate the part of the enclosure interior above the shroud 70 and below the shroud.

The embodiments shown in FIGS. 2 and 3 are substantially the same for FIG. 4 as for FIG. 1. The mask or membrane 34 corresponds to the mask or membrane MA1, the apertures 32 to the apertures AP1, the pipe 70 to the pipe PI1, and the shroud 77 to the shroud SH1.

While embodiments of the invention have been described in detail, it will be evident that the invention may be embodied otherwise.

What is claimed is:

1. A method of space charge neutralization of electrons passing through apertures in one direction in electron beam exposure machines, comprising:

bleeding gas into the vicinity of the apertures; and pumping the gas out from the direction electron travel.

2. A method as in claim 1, wherein the gas is any one of helium, neon, argon, krypton, xenon, hydrogen, nitrogen, oxygen, chlorine, mercury gas, sodium gas, cesium gas, and sulphur hexaflouride ($SF_6$).

3. A method of performing electron beam exposure, comprising:

forming an electron beam;

passing the electron beam in a direction through a plurality of apertures in a mask and onto a writing surface;

bleeding gas into the vicinity of the apertures; and pumping the gas out from the direction electron travel.

4. A method as in claim 3, wherein the gas is any one of helium, neon, argon, krypton, xenon, hydrogen, nitrogen, oxygen, chlorine, mercury gas, sodium gas, cesium gas, and sulphur hexaflouride ($SF_6$).

5. An electron beam exposure machine, comprising:

an enclosure;

an gas evacuation pump connected to said enclosure;

a source of electrons in said enclosure;

a electron beam-forming focusing lens arrangement in said enclosure and in a path of electrons from said source;

a workpiece holder in a path of electron beams from said lens arrangement;

a mask having apertures at a crossover plane of electrons from the focusing lens arrangement in the path of electron beams toward said workpiece holder, said mask being in said enclosure; and a gas pump having gas emerging at the apertures in said mask at the entrance of electron beams at said mask.

6. A machine as in claim 5, wherein the gas is any one of helium, neon, argon, krypton, xenon, hydrogen, nitrogen, oxygen, chlorine, mercury gas, sodium gas, cesium gas, and sulphur hexaflouride ($SF_6$).

* * * * *